(12) United States Patent
Paik et al.

(10) Patent No.: US 8,791,353 B2
(45) Date of Patent: Jul. 29, 2014

(54) ALUMINA PASTE SUBLIMATION SUPPRESSION BARRIER FOR THERMOELECTRIC DEVICE

(75) Inventors: Jong-Ah Paik, Pasadena, CA (US); Thierry Caillat, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 673 days.

(21) Appl. No.: 12/723,570

(22) Filed: Mar. 12, 2010

(65) Prior Publication Data

US 2010/0229910 A1 Sep. 16, 2010

Related U.S. Application Data

(60) Provisional application No. 61/159,736, filed on Mar. 12, 2009.

(51) Int. Cl.
*H01L 35/34* (2006.01)
*H01L 37/00* (2006.01)
*H01L 35/30* (2006.01)
*H01L 35/20* (2006.01)
*H01L 35/18* (2006.01)

(52) U.S. Cl.
CPC ............ *H01L 35/18* (2013.01); *H01L 35/34* (2013.01)
USPC ............................ 136/240; 136/201; 136/205

(58) Field of Classification Search
USPC ............... 136/201, 205, 236.1, 240; 438/54
See application file for complete search history.

(56) References Cited

U.S. PATENT DOCUMENTS

| 3,617,376 | A | * | 11/1971 | Miller ............................ 428/335 |
| 3,822,152 | A | | 7/1974 | Kot |
| 4,497,973 | A | * | 2/1985 | Heath et al. .................... 136/212 |
| 2006/0118160 | A1 | * | 6/2006 | Funahashi et al. .......... 136/236.1 |

FOREIGN PATENT DOCUMENTS

JP 79026873 B * 9/1979

OTHER PUBLICATIONS

Winter et al., "The Design of a Nuclear Power Supply with a 50 Year Life Expectancy: The JPL Voyager's SiGe MHW RTG," IEEE AES Systems Magazine, Apr. 2000, pp. 5-12.
Brown et al., "Yb14MnSb11: New High Efficiency Thermoelectric Materials for Power Generation," Chem. Mater., 18, 2006, 1873-1877.
Rowe, "Recent Advances in Silicon-Germanium Alloy Technology and ...," Journal of Power Sources, 19 (1987), pp. 247-259.
RCA, "Silicon Germanium Thermoelectric Materials and Module Development Program," ALO (2510)-T1, AEC Research and Development Rep, Cat. UC33, TID 4500, 1969.
Hendricks et al., "Engineering Scoping Study of Thermoelectric Generator Systems for Industrial Waste Heat Recovery," U.S. DOE, Nov. 2006.

* cited by examiner

*Primary Examiner* — Eli Mekhlin
(74) *Attorney, Agent, or Firm* — Canady & Lortz LLP; Bradley K. Lortz

(57) ABSTRACT

Alumina as a sublimation suppression barrier for a Zintl thermoelectric material in a thermoelectric power generation device operating at high temperature, e.g. at or above 1000K, is disclosed. The Zintl thermoelectric material may comprise $Yb_{14}MnSb_{11}$. The alumina may be applied as an adhesive paste dried and cured on a substantially oxide free surface of the Zintl thermoelectric material and polished to a final thickness. The sublimation suppression barrier may be finalized by baking out the alumina layer on the Zintl thermoelectric material until it becomes substantially clogged with ytterbia.

6 Claims, 4 Drawing Sheets

ALUMINA PASTE SUBLIMATION SUPPRESSION BARRIER FOR THERMOELECTRIC DEVICE

CROSS-REFERENCE TO RELATED APPLICATIONS

This application claims the benefit under 35 U.S.C. §119(e) of the following U.S. provisional patent application, which is incorporated by reference herein:

U.S. Provisional Patent Application No. 61/159,736, filed Mar. 12, 2009, and entitled "ALUMINA PASTE LAYER AS A SUBLIMATION SUPPRESSION BARRIER FOR $Yb_{14}MnSb_{11}$", by Paik et al.

STATEMENT OF GOVERNMENT RIGHTS

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

This invention relates to thermoelectric devices. Particularly, this invention relates to sublimation suppression of Zintl-based thermoelectric power generation devices.

2. Description of the Related Art

Thermoelectric materials exhibit the property of producing an electric voltage from an applied temperature differential across the material, the so-called thermoelectric effect of Peltier-Seebeck effect. Accordingly, such materials may be used in thermoelectric devices to generate electrical power from a temperature differential. Such thermoelectric generators have been used to convert heat directly to electrical power for applications including isolated facilities or space applications. Depending upon the application, the applied heat may be naturally available or generated, e.g. by burning fuel or from a decaying radioisotope.

Previously, thermoelectric power generation for deep space applications have employed SiGe thermoelectric materials generating electric power using a decaying radioisotope, e.g. plutonium 238, as a heat source, in a radioisotope thermoelectric generator (RTG). The fuel source and solid state nature of the devices afford exceptional service life and reliability, paramount considerations in space applications which offset the relatively low efficiency of such devices. Many working RTG devices for space applications have been developed and successfully employed. See e.g. Winter et al., "The Design of a Nuclear Power Supply with a 50 Year Life Expectancy: The JPL Voyager's SiGe MHW RTG," IEEE AES Systems Magazine, April 2000, pp. 5-12; and U.S. Pat. No. 3,822,152, issued Jul. 2, 1974 to Kot, which are incorporated by reference herein.

Recent focus on environmental and conservation issues has resulted in renewed interest in thermoelectric materials and devices. Zintl materials in particular have been studied for thermoelectric applications. A particular Zintl compound, $Yb_{14}MnSb_{11}$, has shown exceptional promise for thermoelectric power generation applications. See e.g. Brown et al., "$Yb_{14}MnSb_{11}$: New High Efficiency Thermoelectric Materials for Power Generation," Chem. Mater., 18, 2006, 1873-1877, which is incorporated by reference herein. However, defining the properties of a particular material are only a first step in the development of a practical thermoelectric power generation device using that material.

SiGe has been well studied as a thermoelectric material as a result of previous RTG development. See e.g., Rowe, "Recent Advanced in Silicon-Germanium Alloy Technology and an Assessment of the Problems of Building the Modules for a Radioisotope Thermoelectric Generator," Journal of Power Sources, 19 (1987), pp. 247-259; and "Silicon Germanium Thermoelectric Materials and Module Development Program," ALO (2510)-T1, AEC Research and Development Rep, Cat. UC33, TID 4500, which are incorporated by reference herein. However, although the general configurations of previously developed SiGe thermoelectric power generation devices may be applicable, there are differences in the physical properties of Zintl materials and SiGe that demand new solutions in the development of a practical thermoelectric power generation devices using Zintl materials; the solutions for SiGe thermoelectric materials cannot be readily applied to Zintl thermoelectric materials.

At very high temperatures, e.g. 1,000 K, sublimation of the thermoelectric material can be quite high. Without suppressing sublimation of the thermoelectric material, the service life of a thermoelectric power generation device may be limited to only a few weeks. This may be further exacerbated in low pressure or vacuum environments such as in space applications. In the case of previously developed SiGe thermoelectric power generation devices, a coating of $Si_3N_4$ has been found as the preferred solution to suppress sublimation. However, $Si_3N_4$ is ineffective as a sublimation suppressor for Zintl materials, particularly $Yb_{14}MnSb_{11}$, because SiGe is very different from Zintl. Sublimation species and phenomena are different in different thermoelectric materials. Accordingly, different materials require different sublimation barriers. So, although a $Si_3N_4$ layer is suitable for SiGe, it is not going to work for Zintl. In another example, PbTe and Tellurium-Antimony-Germanium-Silver (TAGS), used for the Multi-Mission Radioisotope Thermoelectric Generator (MMRTG), employs Ar gas as a sublimation suppression barrier because no coating option has been found to work with PbTe and TAGS. Thus, different thermoelectric materials require different sublimation suppression barrier solutions.

In view of the foregoing, there is a need in the art for apparatuses and methods for improved sublimation suppression in thermoelectric devices using Zintl materials such as $Yb_{14}MnSb_{11}$. There is particularly a need for such apparatuses and methods in Zintl-based thermoelectric devices operating at high temperatures, e.g. around or above 1,000 K. There is a need for such apparatuses and methods to extend the service life of such thermoelectric devices. There is a need for such apparatuses and methods to operate for such thermoelectric devices in space applications. These and other needs are met by embodiments of the present invention as detailed hereafter.

SUMMARY OF THE INVENTION

Alumina as a sublimation suppression barrier for a Zintl thermoelectric material in a thermoelectric power generation device operating at high temperature, e.g. at or above 1000K, is disclosed. The Zintl thermoelectric material may comprise $Yb_{14}MnSb_{11}$. The alumina may be applied as an adhesive paste dried and cured on a substantially oxide free surface of the Zintl thermoelectric material and polished to a final thickness. The sublimation suppression barrier may be finalized by baking out the alumina layer on the Zintl thermoelectric material until it becomes substantially clogged with ytterbia.

A typical embodiment of the invention comprises a thermoelectric device, including a Zintl thermoelectric material for generating electrical power from heat, and an alumina layer coating a substantially oxide free surface of the Zintl thermoelectric material. The Zintl thermoelectric material generates the electrical power at a temperature of at least 1000K. Typically, the Zintl thermoelectric material comprises $Yb_{14}MnSb_{11}$. The Zintl thermoelectric material may operates substantially in a vacuum and the heat for generating the electrical power may be generated by a decaying radioisotope.

In some embodiments of the invention, the alumina layer may be polished to a final thickness, e.g. of at least approximately 100 µm thick. In addition, the alumina layer may be applied in an adhesive paste dried and cured on the substantially oxide free surface of the Zintl thermoelectric material. Typically, the alumina layer is substantially porous and becomes substantially clogged with a byproduct of sublimation of the Zintl thermoelectric material, e.g. ytterbia in the case of $Yb_{14}MnSb_{11}$.

A typical method embodiment of the invention for forming a sublimation suppression barrier in a thermoelectric device, comprising the steps of providing a Zintl thermoelectric material (e.g. $Yb_{14}MnSb_{11}$), and coating a substantially oxide free surface of the Zintl thermoelectric material with an alumina layer. The method embodiment of the invention may be further modified consistent with the apparatus embodiments described herein.

In some embodiments of the invention, the method further comprises baking out the coated Zintl thermoelectric material until the alumina layer becomes substantially clogged with a byproduct of sublimation of the Zintl thermoelectric material, e.g. ytterbia. The method may also further include polishing the Zintl thermoelectric material to produce the substantially oxide free surface prior to coating with the alumina layer.

In further embodiments of the invention, coating the substantially oxide free surface of the Zintl thermoelectric material comprises applying the alumina layer in an adhesive paste. The adhesive paste may be applied with an initial thickness of at least approximately 300 µm. In addition, the method may further include drying and curing the applied adhesive paste. Also, the method may additionally include polishing the dried and cured adhesive paste to a final thickness, e.g. of at least approximately 100 µm.

Another typical embodiment of the invention may comprise thermoelectric device having a Zintl thermoelectric material means for generating electrical power from heat, and an alumina layer means for coating a substantially oxide free surface of the Zintl thermoelectric material. The Zintl thermoelectric material means generates the electrical power at a temperature of at least 1000K. This embodiment of the invention may be further modified consistent with the apparatus or method embodiments described herein.

BRIEF DESCRIPTION OF THE DRAWINGS

Referring now to the drawings in which like reference numbers represent corresponding parts throughout.

DETAILED DESCRIPTION OF THE PREFERRED EMBODIMENT

1. Overview

As previously mentioned, embodiments of the present invention are directed to suppressing sublimation of Zintl thermoelectric materials, particularly $Yb_{14}MnSb_{11}$, operating at temperatures above 1000K. A novel sublimation suppression barrier for such Zintl thermoelectric materials may be formed with alumina ($Al_2O_3$) applied in an adhesive paste to surfaces of the Zintl material that have been recently cleaned of oxide. A thermoelectric power generation device employing a Zintl thermoelectric material, such as $Yb_{14}MnSb_{11}$, operating at temperatures in excess of 1000K (e.g. around approximately 1273K) and possibly in a vacuum environment may achieve a service life of fourteen years employing an alumina sublimation suppression barrier.

Embodiments of the invention are directed to Zintl phase thermoelectric materials including rare earth elements such as Yb. Rare earth elements are more likely to oxidize and therefore may be expected clog an alumina paste which will aid in sublimation suppression.

2. Suppressing Sublimation of Zintl Materials in Thermoelectric Devices

Figure 1:
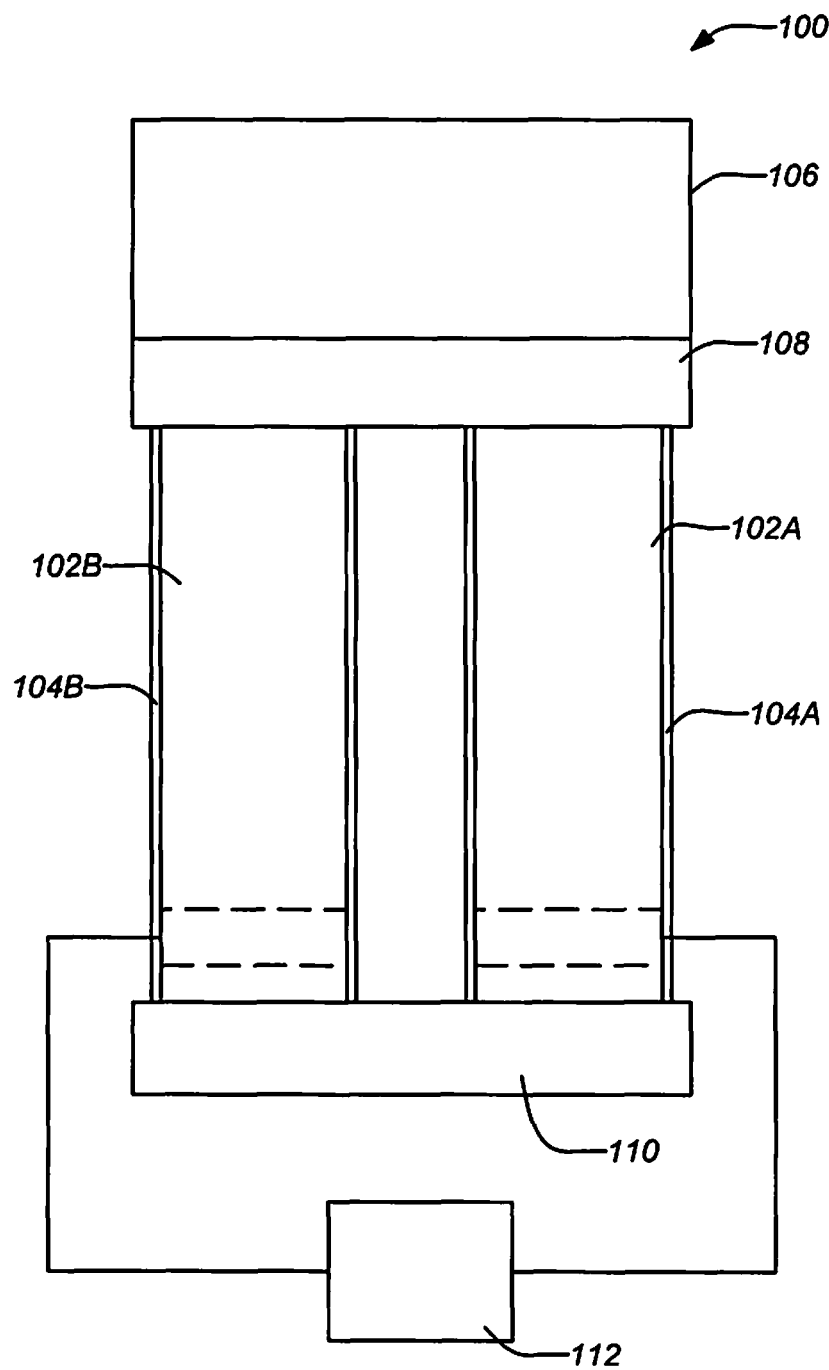
FIG. 1 is a schematic diagram of an exemplary thermoelectric device employing a Zintl thermoelectric material with an alumina sublimation suppression barrier.

FIG. 1 is a schematic diagram of an exemplary thermoelectric device 100 employing two thermoelectric material elements 102A, 102B. The thermoelectric material elements 102A, 102B of the thermoelectric device 100 generate electrical power directly from the applied thermal gradient between the hot shoe 108 at one end and the cold shoe 110 at the other end. One of the thermoelectric material elements 102B acts as an n-type material providing excess electrons while the other thermoelectric material element 102A acts as an p-type material with deficient electrons.

At least one of the thermoelectric elements 102A, 102B comprises a Zintl thermoelectric material having an alumina coating 104A, 104B as sublimation suppression barriers. Typically, the Zintl thermoelectric material such as $Yb_{14}MnSb_{11}$ may be employed for the p-type thermoelectric material element 102A, while another thermoelectric material such as LaTe may be employed for the n-type thermoelectric material element 102B. However, those skilled in the art will appreciate that other combinations of thermoelectric materials may be employed for embodiments of the invention. Furthermore, each thermoelectric element 102A, 102B may comprise a combination of thermoelectric materials. Embodiments of the invention benefit from any exposed surfaces of the thermoelectric elements 102A, 102B which may comprise a Zintl thermoelectric material such as $Yb_{14}MnSb_{11}$ having an alumina coating 104A, 104B to suppress sublimation. (Other thermoelectric materials may optimally employ different sublimation suppression barriers as previously mentioned.)

The two thermoelectric material elements 102A, 102B are thermally coupled in parallel between the hot shoe 108 and cold shoe 110 but electrically isolated from one another. Heat is provided to the hot shoe 108 from a coupled heat source 106, e.g. a decaying radioisotope such as plutonium 238 or any other suitable heat source capable of generating temperatures at or above 1000K. In contrast, the cold shoe 110 at the opposing end typically includes a radiator for rejecting heat to enhance the temperature differential across the thermoelectric material elements 102A, 102B. Electrical power is yielded from an electrical series connection across the two thermoelectric material elements 102A, 102B. Typically, the electrical power is coupled to a power system 112 which may include a regulator and/or battery subsystems as known in the art.

It should be noted that the thermoelectric device 100 depicted in FIG. 1 is not to scale and presents only a generalized thermoelectric power generation device. The thermoelectric device 100 is just one example configuration of an embodiment of the invention utilizing an alumina coating sublimation suppression barrier of a Zintl thermoelectric material. Those skilled in the art will appreciate that the general configurations of previously developed thermoelectric power generation devices, e.g. SiGe and other RTGs, but with a Zintl thermoelectric element having an alumina coating instead. For example, a practical power generation device may employ multiple stages (each like the single stage shown in the figure) coupled together to produce more power. In addition, the Zintl thermoelectric material elements 102A, 102B may also include other materials, e.g. to facilitate electrical connection to the power system 112 and electrical isolation, e.g. graphite barriers may be employed in the element stack. The heating element 106 need not be directly adjacent to the hot shoe 108 but may only be thermally coupled to the hot shoe 108 instead.

It should also be noted that embodiments of the invention are not restricted to thermoelectric power generation devices, but may be applied to any application (e.g., possibly thermoelectric coolers and heaters as well) employing a Zintl thermoelectric material such as $Yb_{14}MnSb_{11}$ operating a temperates at or above 1000K. In addition, although embodiments of the invention are not restricted to space applications where exposure to a vacuum environment may present enhanced sublimation. Embodiments of the invention may be employed with other environments surrounding the Zintl thermoelectric material. For example, some applications may utilize an Ar environment surrounding the thermoelectric material.

Commercial alumina adhesive paste (e.g., RESBOND 989-FS from Cotronics Corporation) may be applied to $Yb_{14}MnSb_{11}$ as the sublimation suppression barrier. Because alumina paste tends to form sediments during storage, the adhesive paste should be mixed thoroughly so that a substantially uniform alumina adhesive paste layer is formed at application. In addition, because $Yb_{11}MnSb_{14}$ tends to form an oxide layer if stored in air, exposed surfaces of the $Yb_{11}MnSb_{14}$ thermoelectric element may first be polished just prior to application of the alumina adhesive paste coating in order to produce a substantially oxide free surface.

Although application of an adhesive paste to develop the alumina layer is described herein, an alumina layer may alternately be applied by any other known technique to provide sublimation suppression for a Zintl thermoelectric material. For example, known sol-gel coating solutions may alternately be employed to produce an alumina layer. Such coatings employ an alumina precursor, such as aluminum hydroxide or aluminum-isopropoxide. This precursor will convert to alumina through a sol-gel reaction before and after application to a Zintl surface. The solution may include some type of solvent (e.g., water or alcohol) and the alumina precursor and/or ceramic particles and/or binder and/or catalyst. (The primary constituents are the solvent and alumina precursor). Other suitable techniques for application of the alumina layer may employ alumina particles in a ceramic paste that may be applied to the surface and dried and/or cured.

In one example, thermoelectric elements may be bonded to other materials in a stack, e.g. graphite blocks at the ends of cut $Yb_{14}MnSb_{11}$ thermoelectric material. The alumina may be applied over any exposed surfaces of the thermoelectric material in an adhesive paste form. The adhesive paste layer should overlap the surface any boundaries between the thermoelectric material and the adjacent bonded graphite to ensure complete protection. When applied, the initial thickness of alumina adhesive paste layer may be approximately 300 After drying at room temperature for more than approximately 1 hour, the alumina adhesive paste cures hard enough to be polished. The final thickness of alumina adhesive paste may then be reduced to approximately 100 μm by careful lapping, e.g. with approximately 220 grit sandpaper. After then, the alumina paste layer may then be dried for 12 hours at room temperature and transferred to a 100 C oven for full curing for approximately another 12 hours. Those skilled in the art will appreciate that other initial and final thicknesses of the alumina adhesive paste layer may be employed depending upon the parameters of the applicable thermoelectric device.

Figure 2:
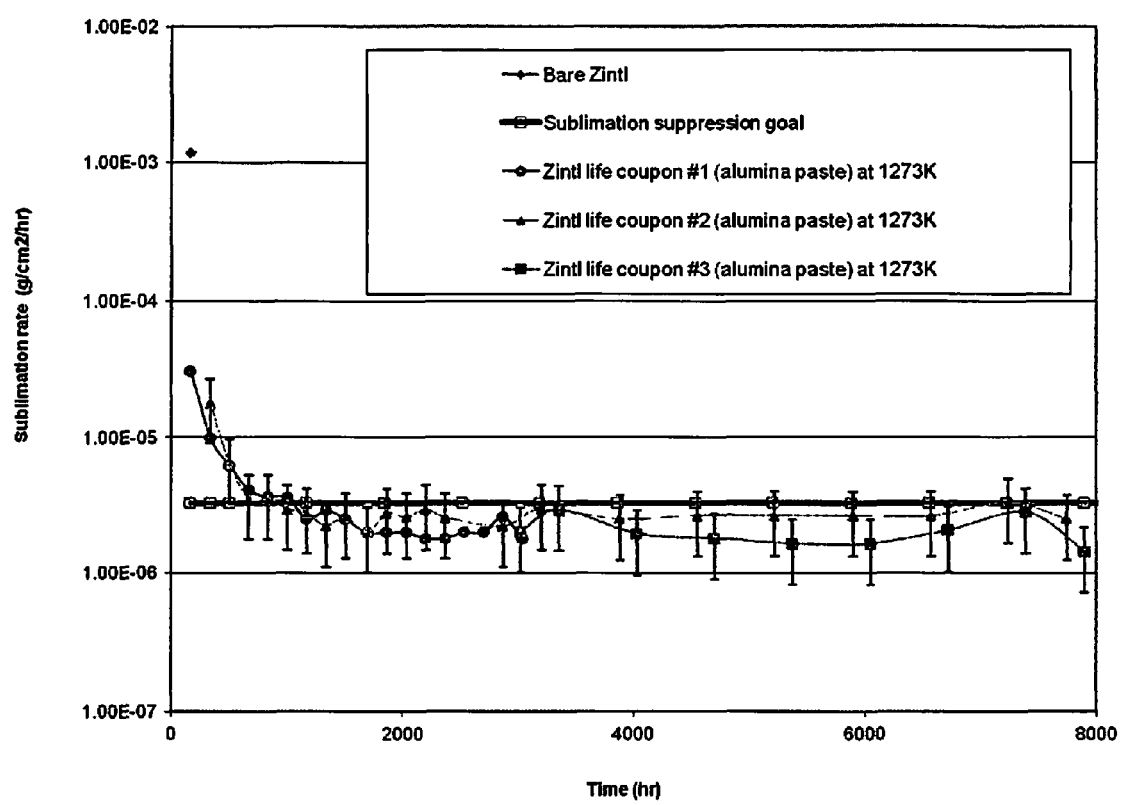
FIG. 2 is a plot of example sublimation rates for an alumina coated Zintl material.

FIG. 2 is a plot of sublimation rates for an alumina coated example Zintl material. Some example $Yb_{11}MnSb_{14}$ coupons exhibited approximately 2 to $3 \times 10^{-6}$ g/cm²/hr sublimation rate at approximately 1000 C (i.e., 1273K) after initial bake out, which is below an estimated sublimation rate threshold required to achieve a 14 year service life. This accommodates less than approximately 10% cross section reduction at the hot side junction of a considered thermoelectric device. As shown in the plot of FIG. 2, the sublimation rate at the beginning of life is relatively high as typical in most sublimation suppression tests. However, the sublimation rate rapidly and steadily decreases. After approximately 1500 hrs at the bake out temperature of 1000 C, the sublimation rate falls below the threshold. It is believed that the sublimation rate decreases with time due to clogging of the pores of alumina layer with a byproduct of the sublimating Zintl thermoelectric material. This clogging constituent is ytterbium in the case of a $Yb_{14}MnSb_{11}$ Zintl thermoelectric material.

It should be noted that in the example application of the alumina layer being applied in the adhesive paste form, the layer is first formed with paste being dried and/or cured at lower temperatures, e.g. room temperature and possibly a 100 C oven. The layer may also then be polished to a final thickness. Following this, a bake out process may be employed to clog the alumina layer and stabilize sublimation of the Zintl thermoelectric material.

Figure 3:
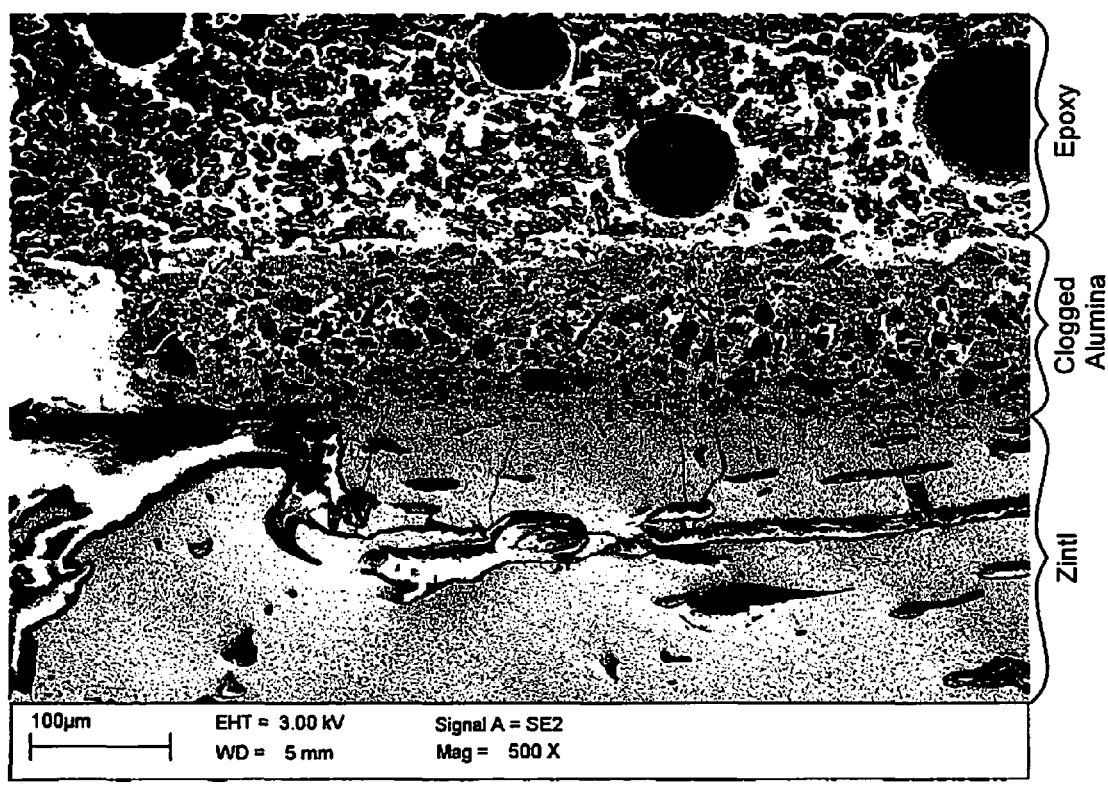
FIG. 3 shows a magnified cross section image of an exemplary alumina layer on a Zintl $Yb_{14}MnSb_{11}$ thermoelectric material.

FIG. 3 shows a magnified cross section image of an exemplary alumina layer on a Zintl $Yb_{14}MnSb_{11}$ thermoelectric material. The scanning electron microscope (SEM) image in FIG. 3 confirms that the applied alumina adhesive paste layer is porous and becomes clogged with ytterbium during baking out as a sublimation test. A $Yb_{14}MnSb_{11}$ coupon with alumina adhesive paste layer was prepared for a SEM after eight weeks at approximately 1273K. As shown in FIG. 3, most of alumina paste is dogged with ytterbia (ytterbium oxide), a byproduct of the $Yb_{14}MnSb_{11}$ sublimation. The two distinct bands of alumina dogged with ytterbia and Zintl below it are indicated by the brackets on the right of the image. (The material above the dogged alumina is epoxy for processing the SEM image.) Ytterbia itself is stable at the high operating temperature and chemically inert with $Yb_{14}MnSb_{11}$.

Over time as the sublimation further progresses, the porous alumina adhesive paste layer is converted into a denser composite of alumina and ytterbia and the sublimation rate decreases steadily. The clogging effect enables the alumina adhesive paste layer to reduce sublimation rate of $Yb_{14}MnSb_{11}$ below the required threshold for fourteen years operation.

4. Forming a Sublimation Suppression Barrier of Alumina

Embodiments of the invention also encompass a method of forming a sublimation suppression barrier of alumina for a Zintl thermoelectric material, e.g. $Yb_{14}MnSb_{11}$. As discussed above, a sublimation suppression barrier is required for thermoelectric power generation operating at high temperatures, e.g. around or above 1000K.

Figure 4:
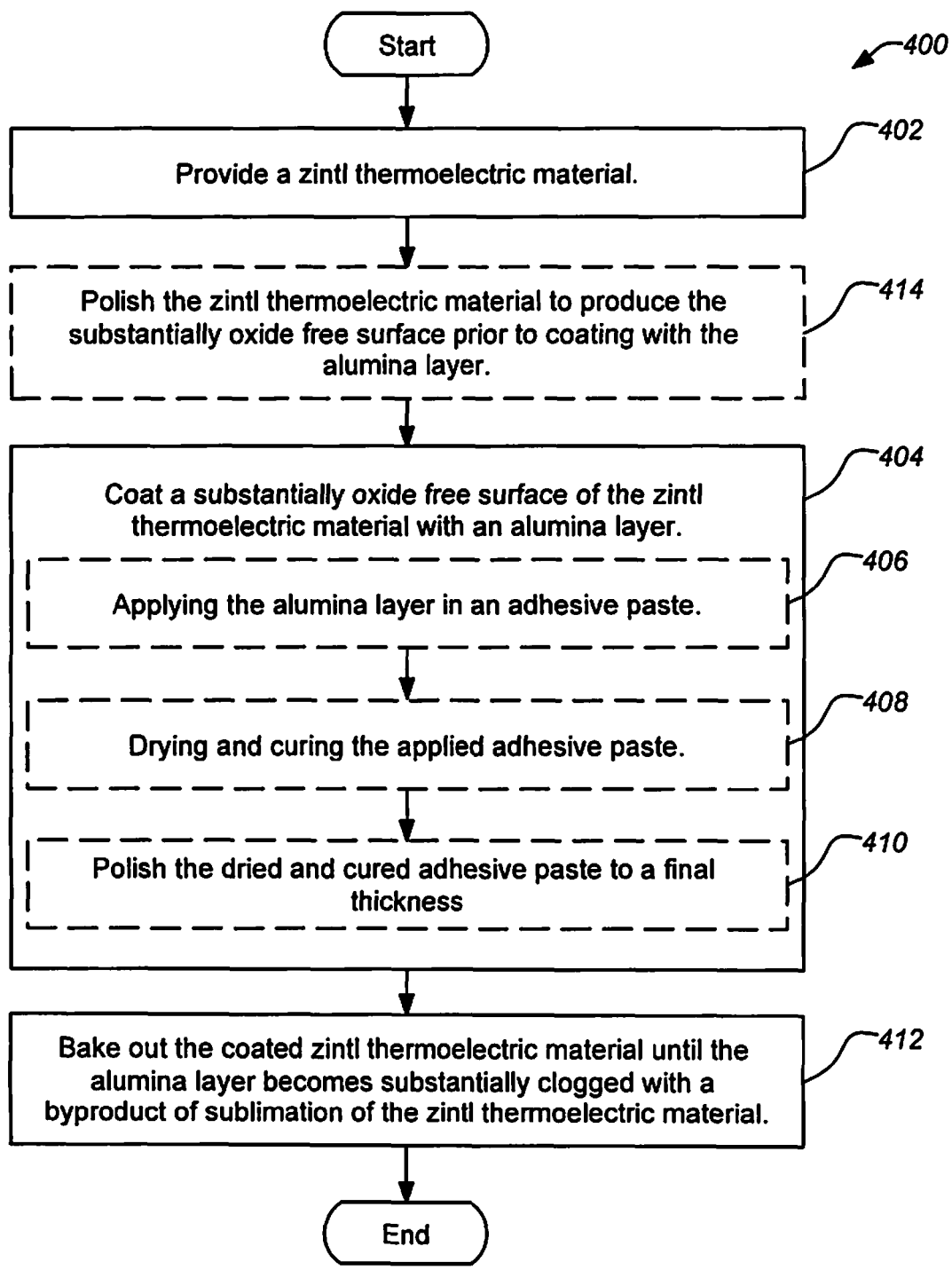
FIG. 4 is a flowchart of an exemplary method of forming a sublimation suppression barrier of alumina for a thermoelectric device.

FIG. 4 is a flowchart of an exemplary method 400 of forming a sublimation suppression barrier of alumina for a thermoelectric device. The method 400 begins with an operation 402 of providing a Zintl thermoelectric material. Typically, the Zintl thermoelectric material may comprise $Yb_{14}MnSb_{11}$. Next in operation 404, a substantially oxide free surface of the Zintl thermoelectric material is coated with an alumina layer. Coating operation 402 may include a number of sub-operations. For example, the coating may comprise a sub-operation 406 of applying the alumina layer in an adhesive paste. The adhesive paste may be applied with an initial thickness of at least approximately 300 μm. In sub-operation 408, the applied adhesive paste is dried and cured. In sub-operation 410, the dried and cured adhesive paste may be polished to a final thickness, e.g. of at least approximately 100 μm. Note that the sub-operations 406-410 are indicated by dashed outlines residing within coating operation 402 in FIG. 4. Those skilled in the art will appreciate that coating the Zintl thermoelectric material with alumina may be achieved through other known processes as well.

The method 400 of forming a sublimation suppression barrier may also be further modified by other optional operations. For example, the method 400 may further include the optional operation 412 of baking out the coated Zintl thermoelectric material until the alumina layer becomes substantially clogged with a byproduct of sublimation of the Zintl thermoelectric material, e.g. ytterbia in the case of $Yb_{14}MnSb_{11}$. As previously described this reduces and stabilizes the sublimation rate of the coated Zintl thermoelectric material. In addition, the method 400 may also include the optional operation 414 of polishing the Zintl thermoelectric material to produce the substantially oxide free surface prior to coating with the alumina layer. The method 400 may also be further enhanced through optional operations consistent with the described parameters and any known techniques of semiconductor device manufacture and Zintl material processing as will be understood by those skilled in the art. Note that the optional operations 410, 412 are indicated by dashed outlines in FIG. 4.

This concludes the description including the preferred embodiments of the present invention. The foregoing description including the preferred embodiment of the invention has been presented for the purposes of illustration and description. It is not intended to be exhaustive or to limit the invention to the precise forms disclosed. Many modifications and variations are possible within the scope of the foregoing teachings. Additional variations of the present invention may be devised without departing from the inventive concept as set forth in the following claims.

What is claimed is:

1. A thermoelectric device, comprising:
   a Zintl thermoelectric material for generating electrical power from heat; and
   an alumina layer coating a substantially oxide free surface of the Zintl thermoelectric material, the alumina layer coating the substantially oxide free surface where sublimation of the Zintl thermoelectric material would otherwise occur;
   wherein the alumina layer is porous and clogged with a byproduct of sublimation of the Zintl thermoelectric material and the Zintl thermoelectric material generates that electrical power at a temperature of at least 1000K; and
   wherein the Zintl thermoelectric material comprises $Yb_{14}MnSb_{11}$.

2. The thermoelectric device of claim 1, wherein the Zintl thermoelectric material operates substantially in a vacuum.

3. The thermoelectric device of claim 1, wherein the heat for generating the electrical power is generated by a decaying radioisotope.

4. The thermoelectric device of claim 1, wherein the alumina layer is polished to a final thickness.

5. The thermoelectric device of claim 1, wherein the alumina layer is at least 100 μm thick.

6. The thermoelectric device of claim 1, wherein the alumina layer is applied in an adhesive paste dried and cured on the substantially oxide free surface of the Zintl thermoelectric material.

* * * * *